(12) United States Patent
Reid et al.

(10) Patent No.: US 10,403,816 B2
(45) Date of Patent: Sep. 3, 2019

(54) CEM SWITCHING DEVICE

(71) Applicant: Arm Limited, Cambridge (GB)

(72) Inventors: Kimberly Gay Reid, Austin, TX (US); Lucian Shifren, San Jose, CA (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/160,291

(22) Filed: Oct. 15, 2018

(65) Prior Publication Data

US 2019/0051824 A1 Feb. 14, 2019

Related U.S. Application Data

(62) Division of application No. 15/264,851, filed on Sep. 14, 2016, now Pat. No. 10,103,327.

(51) Int. Cl.
*H01L 45/00* (2006.01)
*H01L 21/768* (2006.01)
*G11C 13/00* (2006.01)

(52) U.S. Cl.
CPC .......... *H01L 45/12* (2013.01); *G11C 13/0007* (2013.01); *H01L 21/76888* (2013.01); *H01L 45/04* (2013.01); *H01L 45/1233* (2013.01); *H01L 45/14* (2013.01); *H01L 45/146* (2013.01); *H01L 45/165* (2013.01); *H01L 45/1608* (2013.01); *H01L 45/1616* (2013.01); *H01L 45/1625* (2013.01); *H01L 45/1633* (2013.01); *H01L 45/1641* (2013.01); *G11C 2213/15* (2013.01); *G11C 2213/33* (2013.01)

(58) Field of Classification Search
None
See application file for complete search history.

(56) References Cited

U.S. PATENT DOCUMENTS

2005/0127458 A1* 6/2005 Lo ..................... H01L 21/3115
257/410
2008/0106927 A1* 5/2008 Celinska ................ H01L 45/04
365/148

FOREIGN PATENT DOCUMENTS

WO 2018007783 A1 1/2018

OTHER PUBLICATIONS

Ha, Sieu D., Jian Shi, Yasmine Meroz, L. Mahadevan and Shriram Ramanathan. "Neuromimetic Circuits with Synaptic Devices based on Strongly Correlated Electron Systems." Physcial Review Applied, vol. 2, No. 6, Dec. 1, 2014.
(Continued)

*Primary Examiner* — Cheung Lee
(74) *Attorney, Agent, or Firm* — Leveque IP Law, P.C.

(57) ABSTRACT

Subject matter herein disclosed relates to a method for the manufacture of a switching device comprising a silicon-containing correlated electron material. In embodiments, processes are described for forming the silicon-containing correlated electron material. These processes may use comparatively lower temperatures as compared to those used for forming a correlated electron material comprising a transition metal oxide.

20 Claims, 5 Drawing Sheets

(56) References Cited

OTHER PUBLICATIONS

Ignatov Marina, Ziegler Martin, Hansen Mirko, Petraru Adrian, Kohlstedt Hermann, "A memristive spiking neuron with firing rate coding," Frontiers in Neuroscience, vol. 9, Oct. 20, 2015.
Pantazi, Angeliki & Wozniak, Stanislaw & Tuma, Tomas & Eleftheriou, Evangelos, "All-memristive neuromorphic computing with level-tuned neurons." Nanotechnology. 27, No. 35, Jul. 26, 2016.
Tuma, Tomas, Angeliki Pantazi, Manuel Le Gallo, Abu Sebastian and Evangelos Eleftheriou. "Stochastic phase-change neurons." Nature nanotechnology, vol. 11, No. 8, May 16, 2016.

* cited by examiner

```
┌─────────────────────────────────────────────────────────────┐
│  Form a silicon-containing CEM layer comprising $M_xSi_yO_z$:dopant │
└─────────────────────────────────────────────────────────────┘
                              or
┌─────────────────────────────────────────────────────────────┐
│  Form a silicon-containing metal layer comprising $M_xSi_yO_z$     │
└─────────────────────────────────────────────────────────────┘
                             and
┌─────────────────────────────────────────────────────────────┐
│  Treat the silicon-containing metal layer with dopant to form     │
│  silicon-containing CEM layer comprising $M_xSi_yO_z$:dopant       │
└─────────────────────────────────────────────────────────────┘
                              or
┌─────────────────────────────────────────────────────────────┐
│  Form a silicon-containing metal layer comprising $M_xSi_y$:dopant │
└─────────────────────────────────────────────────────────────┘
                             and
┌─────────────────────────────────────────────────────────────┐
│  Oxidize the silicon-containing metal layer to form a silicon-containing │
│  CEM layer comprising $M_xSi_yO_z$:dopant                          │
└─────────────────────────────────────────────────────────────┘
                              or
┌─────────────────────────────────────────────────────────────┐
│  Form a silicon-containing metal layer comprising $M_xSi_y$        │
└─────────────────────────────────────────────────────────────┘
                             and
┌─────────────────────────────────────────────────────────────┐
│  Oxidize the silicon-containing metal layer to form a silicon-containing │
│  metal layer comprising $M_xSi_yO_z$                               │
└─────────────────────────────────────────────────────────────┘
                             and
┌─────────────────────────────────────────────────────────────┐
│  Treat the silicon-containing metal layer to incorporate a dopant and │
│  form a silicon-containing CEM layer comprising $M_xSi_yO_z$:dopant │
└─────────────────────────────────────────────────────────────┘

┌─────────────────────────────────────────────────────────────┐
│  M = a d- or f-block transition metal element; x, y and z are each │
│  greater than zero                                                 │
└─────────────────────────────────────────────────────────────┘
```

CEM SWITCHING DEVICE

FIELD OF THE DISCLOSURE

The present disclosure relates to a switching device comprising a correlated electron material (CEM) layer and to methods for the manufacture of the device.

BACKGROUND

Electronic switching devices are found in a wide variety of electronic device types, such as computers, digital cameras, cellular telephones, tablet devices, personal digital assistants and so forth, where they may function as memory and/or logic devices.

Factors of interest to a designer in considering whether a particular electronic switching device is suitable for such a function, may include physical size, storage density, operating voltages, impedance ranges, and/or power consumption. Other factors of interest may include cost of manufacture, ease of manufacture, scalability and/or reliability.

BRIEF DESCRIPTION OF THE DRAWINGS

Further embodiments in the aforementioned aspects will be apparent from the general description which follows wherein reference is made to the following drawings:

FIG. 6 shows flow diagrams generally illustrating steps in the manufacture of the CEM switching device of FIG. 2.

DETAILED DESCRIPTION

Figure 1A:
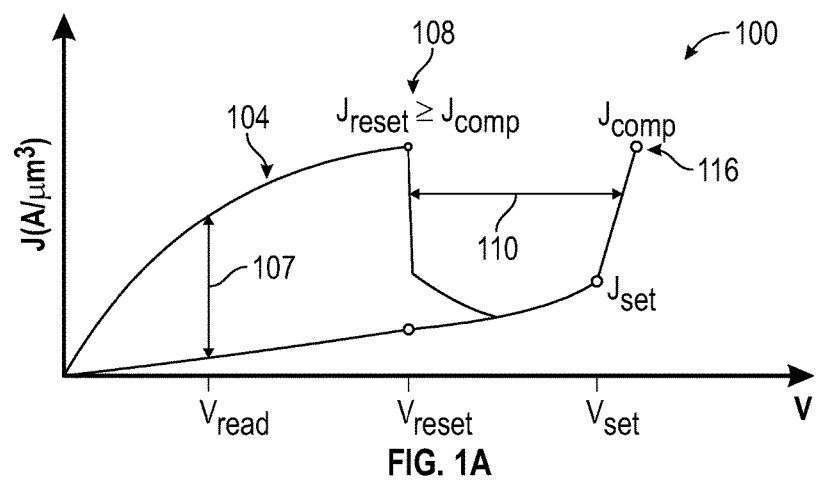
FIG. 1A shows a schematic illustration of a current density versus voltage profile of a CEM switching device.

There appears to be an ever-increasing drive towards memory and/or logic devices exhibiting lower power and/or higher speed. Switching devices comprising a CEM are at the forefront of this drive not just because they can exhibit low power and/or high speed but also because they are generally reliable and easily and cheaply manufactured.

The present disclosure describes methods for the manufacture of a switching device based upon a silicon-containing CEM. The CEM switching device may, for example, find application as a correlated electron random access memory (CERAM) in memory and/or logic devices which may be used with a wide range of electronic circuit types, such as memory controllers, memory arrays, filter circuits, data converters, optical instruments, phase locked loop circuits, microwave and millimeter wave transceivers, and so forth.

A CEM switching device can exhibit a rapid conductor-to-insulator transition as compared to other switching devices because the switching is brought about by an electron correlation rather than by a solid state structural phase change or by formation of filaments, as is found respectively in phase change memory devices and resistive RAM devices.

The rapid conductor-to-insulator transition of a CEM switching device may, in particular, be responsive to a quantum mechanical phenomenon in contrast to the melting/solidification or filament formation found respectively in phase change and resistive RAM devices. The quantum mechanical transition in a CEM switching device between a relatively conductive state and a relatively insulative state (or between a first impedance state and a second impedance state) may occur in several ways.

In one respect, a quantum mechanical transition of a CEM between a relatively insulative/higher impedance state and a relatively conductive/lower impedance state may be understood in terms of a Mott transition. In accordance with a Mott transition, a material may switch from a relatively insulative/higher impedance state to a relatively conductive/lower impedance state if a Mott transition condition is satisfied. The Mott criteria may be defined by $(n_c)^{1/3} a \approx 0.26$, wherein $n_c$ denotes a concentration of electrons, and wherein "a" denotes the Bohr radius. If a threshold carrier concentration is achieved, such that the Mott criteria is met, the Mott transition is believed to occur. Responsive to the Mott transition occurring, the state of the CEM device changes from a relatively higher resistance/higher capacitance state (e.g., an insulative/higher impedance state) to a relatively lower resistance/lower capacitance state (e.g., a conductive/lower impedance state).

In another respect, the Mott transition may be controlled by a localization of electrons. If carriers, such as electrons, for example, are localized, a strong coulomb interaction between the carriers is believed to split the bands of the CEM to bring about a relatively insulative (relatively higher impedance) state. If electrons are no longer localized, a weak coulomb interaction may dominate, which may give rise to a removal of band splitting, which may, in turn, bring about a metal (conductive) band (relatively lower impedance state) that is substantially dissimilar from the relatively higher impedance state.

The switching from a relatively insulative/higher impedance state to a relatively conductive/lower impedance state may bring about a change in capacitance in addition to a change in resistance. For example, a CEM switch may exhibit a variable resistance together with a property of variable capacitance. In other words, impedance characteristics of a CEM switch may include both resistive and capacitive components. For example, in a metal state, a CEM switch may comprise a relatively low electric field that may approach zero, and therefore may exhibit a substantially low capacitance, which may likewise approach zero.

Similarly, in a relatively insulative/higher impedance state, which may be brought about by a higher density of bound or correlated electrons, an external electric field may be capable of penetrating the CEM and, therefore, the CEM may exhibit higher capacitance based, at least in part, on additional charges stored within the CEM. Thus, for example, a transition from a relatively insulative/higher impedance state to a relatively conductive/lower impedance state in a CEM switch may result in changes in both resistance and capacitance.

A switching device formed from a CEM may exhibit switching of impedance states responsive to a Mott-transition in a majority of the volume of the CEM comprising the device. The CEM may, in particular, form a "bulk switch". As used herein, the term "bulk switch" refers to at least a majority volume of a CEM switching a device's impedance state, such as in response to a Mott-transition. For example, substantially all CEM of a device may switch from a relatively insulative/higher impedance state to a relatively conductive/lower impedance state or from a relatively conductive/lower impedance state to a relatively insulative/higher impedance state responsive to a Mott-transition.

In one arrangement, shown in FIG. 1, a CEM switching device may comprise a CEM layer sandwiched between a conductive substrate and a conductive overlay. In this arrangement, the CEM switching device can act as memory storage element. In other arrangements, the CEM switching device may comprise either a CEM layer provided on a conductive substrate or a CEM layer provided with a conductive overlay. In these other arrangements, the device comprises source and a drain regions providing for a flow of current across the device.

Referring now to FIG. 1A, a current density versus voltage profile 100 of a CEM switching device is shown which illustrates its switching behaviour. Based, at least in part, on a voltage applied to terminals of a CEM device, for example, during a "write operation," the CEM device may be placed into a relatively low-impedance state or a relatively high-impedance state. For example, application of a voltage $V_{set}$ and a current density $J_{set}$ may bring about a transition of the CEM switching device to a relatively low-impedance memory state. Conversely, application of a voltage $V_{reset}$ and a current density $J_{reset}$ may bring about a transition of the CEM device to a relatively high-impedance memory state.

As shown in FIG. 1A, reference designator 110 illustrates the voltage range that may separate $V_{set}$ from $V_{reset}$. Following placement of the CEM switching device into a high-impedance state or a low-impedance state, the particular state of the CEM switching device may be detected by application of a voltage $V_{read}$ (e.g., during a read operation) and detection of a current or current density at terminals of the CEM switching device (e.g., utilizing read window 107).

In accordance with FIG. 1A, if sufficient bias is applied (e.g., exceeding a band-splitting potential) and the aforementioned Mott condition is satisfied (e.g., injected electron holes are of a population comparable to a population of electrons in a switching region, for example), a CEM switching device may switch from a relatively low-impedance state to a relatively high-impedance state, for example, responsive to a Mott transition. This may correspond to point 108 of the voltage versus current density profile of FIG. 1A. At, or suitably nearby this point, electrons are no longer screened and become localized near the metal ion. This correlation may result in a strong electron-to-electron interaction potential which may operate to split the bands to form a relatively high-impedance material.

If the CEM switching device comprises a relatively high-impedance state, current may be generated by transportation of electron holes. Consequently, if a threshold voltage is applied across terminals of the CEM device, electrons may be injected into a metal-insulator-metal (MIM) diode over the potential barrier of the MIM device. In certain devices, injection of a threshold current of electrons, at a threshold potential applied across terminals of a CEM device, may perform a "set" operation, which places the CEM device into a low-impedance state. In a low-impedance state, an increase in electrons may screen incoming electrons and remove a localization of electrons, which may operate to collapse the band-splitting potential, thereby giving rise to the low-impedance state.

The current in a CEM switching device may be controlled by an externally applied "compliance" condition, which may be determined at least partially on the basis of an applied external current, which may be limited during a write operation, for example, to place the CEM device into a relatively high-impedance state. This externally-applied compliance current may, in some devices, also set a condition of a current density for a subsequent reset operation to place the CEM device into a relatively high-impedance state. As shown in the particular device of FIG. 1A, a current density $J_{comp}$ may be applied during a write operation at point 116 to place the CEM switching device into a relatively high-impedance state, may determine a compliance condition for placing the CEM device into a low-impedance state in a subsequent write operation. As shown in FIG. 1A, the CEM device may be subsequently placed into a low-impedance state by application of a current density $J_{reset} \geq J_{comp}$ at a voltage $V_{reset}$ at point 108, at which $J_{comp}$ is externally applied.

The compliance may, in particular, set a number of electrons in a CEM switching device which may be "captured" by holes for the Mott transition. In other words, a current applied in a write operation to place a CEM device into a relatively low-impedance memory state may determine a number of holes to be injected to the CEM device for subsequently transitioning the CEM switching device to a relatively high-impedance memory state.

As pointed out above, a reset condition may occur in response to a Mott transition at point 108. Such a Mott transition may bring about a condition in the CEM switching device in which a concentration of electrons n approximately equals, or becomes at least comparable to, a concentration of electron holes p. This condition may be modeled according to expression (1) as follows:

$$\lambda_{TF} n^{\frac{1}{3}} = C \sim 0.26 \qquad (1)$$
$$n = \left(\frac{C}{\lambda_{TF}}\right)^3$$

wherein $\lambda_{TF}$ corresponds to a Thomas Fermi screening length, and C is a constant.

A current or current density in region 104 of the voltage versus current density profile shown in FIG. 1A, may exist in response to injection of holes from a voltage signal applied across terminals of the CEM switching device. Here, injection of holes may meet a Mott transition criterion for the low-impedance state to high-impedance state transition at current $I_{MI}$ as a threshold voltage $V_{MI}$ is applied across terminals of a CEM device. This may be modeled according to expression (2) as follows:

$$I_{MI}(V_{MI}) = \frac{dQ(V_{MI})}{dt} \approx \frac{Q(V_{MI})}{t} \qquad (2)$$
$$Q(V_{MI}) = qn(V_{MI})$$

wherein $Q(V_{MI})$ corresponds to the charged injected (holes or electrons) and is a function of an applied voltage. Injection of electrons and/or holes to enable a Mott transition may occur between bands and in response to threshold voltage $V_{MI}$, and threshold current $I_{MI}$. By equating electron concentration n with a charge concentration to bring about a Mott transition by holes injected by $I_{MI}$ in expression (2) according to expression (1), a dependency of such a threshold voltage $V_{MI}$ on Thomas Fermi screening length $\lambda_{TF}$ may be modeled according to expression (3), as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \quad (3)$$

$$J_{reset}(V_{MI}) = J_{MI}(V_{MI}) = \frac{I_{MI}(V_{MI})}{A_{CEM}} = \frac{q}{A_{CEM}t}\left(\frac{C}{\lambda_{TF}(V_{MI})}\right)^3$$

wherein $A_{CEM}$ is a cross-sectional area of a CEM switching device; and $J_{reset}(V_{MI})$ may represent a current density through the CEM switching device to be applied to the CEM switching device at a threshold voltage $V_{MI}$, which may place the CEM switching device into a relatively high-impedance state.

Figure 1B:
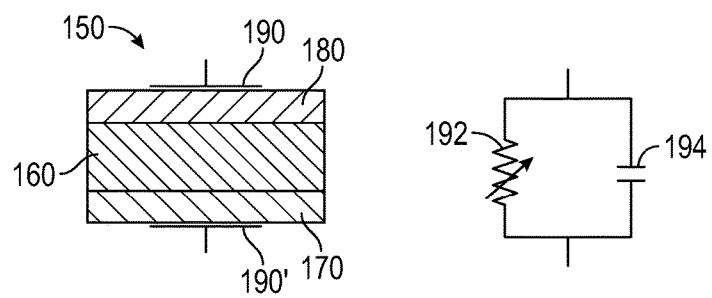
FIG. 1B shows a schematic illustration of the CEM switching device of FIG. 1A and a schematic diagram of an equivalent circuit for the switching device.

FIG. 1B shows a CEM switching device 150 comprising a CEM layer 160 sandwiched between a conductive substrate 170 and a conductive overlay 180 and a schematic diagram of an equivalent circuit for the switching device.

As previously mentioned, the CEM switching device may exhibit characteristics of both variable resistance and variable capacitance. In other words, the CEM switching device may be considered as a variable impedance device in which the impedance depends at least in part on resistance and capacitance characteristics of the device if measured across device terminals 190 and 190'. The equivalent circuit for a variable impedance device may comprise a variable resistor 192, such as variable resistor, in parallel with a variable capacitor 194. Of course, although a variable resistor and variable capacitor are depicted in FIG. 1B as comprising discrete components, the variable impedance device, such as that shown, may comprise a substantially homogenous CEM.

Table 1 below depicts an example truth table for an example variable impedance device, such as the device of FIG. 1A.

TABLE 1

Correlated Electron Switch Truth Table

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied})$~0 | $Z_{low}(V_{applied})$ |

Table 1 shows that a resistance of a variable impedance device, such as that shown, may transition between a low-impedance state and a substantially dissimilar, high-impedance state as a function at least partially dependent on a voltage applied across the CEM switching device. The impedance exhibited at a low-impedance state may, for example, be approximately in the range of 10.0-100,000.0 times lower than an impedance exhibited in a high-impedance state. However, the impedance exhibited at a low-impedance state may be approximately in the range of 5.0 to 10.0 times lower than an impedance exhibited in a high-impedance state. Table 1 also shows that a capacitance of a variable impedance device, such as the device shown, may transition between a lower capacitance state, which may, for example comprise an approximately zero, or very little, capacitance, and a higher capacitance state that is a function, at least in part, of a voltage applied across the CEM switching device.

The CEM switching device may be placed into a relatively low-impedance memory state, such as by transitioning from a relatively high-impedance state, for example, via injection of a sufficient quantity of electrons to satisfy a Mott transition criteria. In transitioning a CEM switching device to a relatively low-impedance state, if enough electrons are injected and the potential across the terminals of the CEM device overcomes a threshold switching potential (e.g., $V_{set}$), injected electrons may begin to screen. As previously mentioned, screening may operate to delocalize double-occupied electrons to collapse the band-splitting potential, thereby bringing about a relatively low-impedance state.

Typically, the CEM switching device comprises a CEM layer comprising one or more a transition metal or transition metal compound such as a transition metal oxides (TMOs). The transition metal may, in particular, comprise nickel oxide, cobalt oxide, iron oxide or yttrium oxide or any other oxide of the d or f-block elements (especially those exhibiting incomplete d- or f-electron shells). It may also comprise an oxide of a rare earth elements, a perovskite such as chromium doped strontium titanate, lanthanum titanate, praseodymium calcium manganate and praseodymium lanthanum manganite as well as other complex (or "mixed") oxides such as those of yttrium, and/or ytterbium.

The present disclosure relates to a switching device comprising a layer of silicon-containing CEM. The silicon-containing CEM layer may, in particular, be "born-on" and have switching properties similar to CEM layers comprising transition metal oxides (TMOs) at similar operating voltages. The silicon-containing CEM layer may, however, be deposited or formed at considerably lower temperatures and/or at considerably higher rates than those employed for CEM layers comprising typical TMOs.

Further, the silicon-containing CEM layer may be amorphous so allowing fine control over the formation of the CEM layer as compared to CEM layers containing TMOs.

In a first aspect, therefore, the present disclosure provides a method for the manufacture of a CEM switching device, which method comprises forming a layer of a silicon-containing CEM.

The method may, in particular, comprise forming a silicon-containing CEM layer comprising a doped metal silicate such as a silicate of a d- or f-block element (especially one exhibiting an incomplete d- or f-electron shell). The silicon-containing CEM layer may, in particular, comprise a silicate of one or more of aluminum, cadmium, chromium, cobalt, copper, gold, iron, manganese, mercury, molybdenum, nickel, palladium, rhenium, silver, tantalum, tin, titanium, vanadium, rhenium, ruthenium, silver, tantalum, tin, titanium, vanadium, yttrium, ytterbium and zinc.

In one embodiment, the method comprises forming the doped metal silicate directly. In another embodiment, the method comprises forming the doped metal silicate by forming a silicon-containing metal layer and oxidising the silicon-containing metal layer with concomitant or subsequent incorporation of a dopant. The silicon-containing metal layer may comprise a metal silicide. In another embodiment, the method comprises forming the doped metal silicate by forming a silicon-containing metal layer with concomitant incorporation of a dopant and oxidising the doped silicon-containing metal layer.

The content of silicon in the silicon-containing CEM layer may be between approximately 1.0 atom % and 20.0 atom %, in particular, between 1.0 atom % and 15.0 atom %. The content of dopant in the silicon-containing CEM layer may be between approximately 0.1 atom % and 15.0 atom %. In one embodiment, the content of silicon in the silicon-containing CEM layer exceeds that of the dopant.

Note that the stoichiometry of the silicate may vary depending on the metal and the method and process conditions by which it is formed. In general, however, the silicate may, for example, be represented by the formula $M_xSi_yO_z$:dopant where each of x, y, and z are above zero and are not necessarily integers.

The dopant may, in particular, derive from a ligand or molecule providing a carbon-metal bond, a halogen-metal bond, a nitrogen-metal bond, a sulphur-metal bond or a phosphorus-metal bond in the silicate. Suitable dopants include those which can donate electrons to the metal silicate. Such "back-donating" may provide that the CEM layer exhibits the property of a controllable and reversible donation of electrons to a conduction band of the metal silicate during operation of the device—thus permitting the metal silicate to switch between a relatively conductive state and a relatively insulative state.

Suitable dopant precursors for back donating dopants may comprise carbon monoxide (CO), ammonia ($NH_3$) or amine ($NR_3$, R=H or alkyl or aryl), such as ethylene diamine ($C_2H_8N_2$), as well as nitrogen oxides of formula $N_xO_y$, viz., nitrous oxide, nitric oxide or nitrogen dioxide.

Other suitable back donating dopants may arise from an organometallic precursor for the metal compound comprising one or more of a carbon-containing ligand, a nitrogen-containing ligand, a phosphorus-containing ligand or a sulfur-containing ligand. Such ligands include carbonyl (—CO), chloro (—Cl), amine (—$NH_3$), alkyl amide (—$NR_3$), sulphide (—SR) and phosphine (—$PR_3$R=aryl, for example, phenyl) as well as more complex ligands such as amidinate (AMD), cyclopentadienyl (Cp), methylcyclopentadienyl (MeCp), ethylcyclopentadienyl (EtCp), pentamethylcyclopentadienyl (MesCp), 2,2,6,6-tetramethylheptane-3,5-dionato (thd), acetylacetonato (acac), methylglyoximato (dmg), 2-amino-pent-2-en-4-onato (apo), 1-dimethylamino-2-methyl-2-butanolato (dmamb), 1-dimethylamino-2-methyl-2-propanolato (dmamp).

In one embodiment, the method comprises forming the doped metal silicate directly by a physical vapour deposition or a chemical vapour deposition of at least one organometallic precursor. The method may, in particular, utilize an atomic layer deposition (ALD) or a metallo-organic chemical vapour deposition (MOCVD) to deposit a doped metal silicate from an organometallic precursor molecule, a silicon-containing precursor molecule and, optionally, an oxidant. In that case, the dopant may originate from one or other of the organometallic precursor molecule or the silicon-containing molecule.

Alternatively or additionally, the method may utilise co-sputtering from metal and silicon targets in an atmosphere containing an oxidant, such as oxygen or ozone and a dopant precursor, to deposit a doped metal silicate. In one embodiment, however, the method comprises co-sputtering from metal, silicon and dopant (for example, carbon) targets in an atmosphere containing an oxidant, such as oxygen or ozone.

In another embodiment, the method may utilise an atomic layer deposition (ALD) or a metallo-organic chemical vapour deposition (MOCVD) to deposit a silicon-containing metal layer comprising a metal silicate from an organometallic precursor molecule, a silicon-containing precursor molecule and, optionally, an oxidant.

In another embodiment, the method may utilize sputtering, co-sputtering, evaporation or co-evaporation to deposit alternate layers of silicon and a metal (or a layer of a metal on a silicon wafer) followed by annealing to form a silicon-containing metal layer comprising a silicide. In one such embodiment, the sputtering, co-sputtering, evaporation or co-evaporation may be carried out in an atmosphere containing a dopant precursor, such as carbon monoxide. In another such embodiment, the annealing may be carried out in an atmosphere comprising a dopant precursor.

In another embodiment, the method may utilize an atomic layer deposition or a chemical vapour deposition to deposit a metal layer on a silicon wafer from an organometallic or inorganic precursor molecule and a reductant such as ammonia ($NH_3$) followed by annealing to form a silicon-containing metal layer comprising a silicide.

The annealing may comprise a rapid thermal annealing (RTA) to temperature or temperatures between 50° C. and 900° C. The annealing (and deposition) of the metal layer may be carried out in vacuo or in a dry ambient atmosphere which is substantially free from oxygen or other oxidant so as to ensure the formation of the silicon-containing metal layer prior to its oxidation.

In another embodiment, the method may utilize a laser- or (remote) plasma-induced chemical vapour deposition to directly deposit a layer of a doped metal silicide. Such chemical vapour depositions avoid the use of the high temperatures generally necessary for the formation of metal silicides by ordinary chemical vapour deposition.

In some embodiments, the method further comprises oxidising the silicon-containing metal layer to a form a silicate. Note that the oxidation does not lead to the formation of an interfacial layer of silicon dioxide within the silicon-containing metal layer. The oxidation may, in particular, comprise one or more of a wet oxidation, a dry oxidation or a plasma oxidation. The wet and dry oxidations may, for example, be carried out by exposing to steam ($H_2O$) and oxygen ($O_2$) respectively at a temperature or temperatures between 150° C. and 900° C. during a period of 1 minute to 30 minutes. The plasma oxidation may be carried out by exposing to oxygen ($O_2$) or ozone ($O_3$) at a temperature or temperatures between 50° C. and 400° C. for a period of 1 minute to 30 minutes.

The method may comprise oxidising the silicon-containing metal layer with concomitant incorporation of a dopant. In these embodiments, a dopant precursor molecule, such as carbon monoxide (CO), ammonia ($NH_3$), chlorine ($Cl_2$) or other halogen may admixed with the above-mentioned oxidants. The admixture may, in particular, provide for exposure to the dopant at a temperature between 20° C. and 1000° C., in particular 50° C. to 800° C. during a period of between 1 second to 5.0 hours.

In some embodiments, the method may further comprise doping the silicon-containing metal layer following its formation or oxidation. The doping may, for example, be carried out by exposing the metal silicate to a dopant precursor, such as carbon monoxide (CO), ammonia ($NH_3$), chlorine ($Cl_2$) or other halogen at a temperature between 20° C. and 1000° C., in particular 50° C. to 800° C. during a period of between 1 second to 5.0 hours.

Other suitable dopant precursors include nitrogen containing molecules of the form $C_xH_yN_z$ (in which x and y≥0 and N is ≥0) such as ammonia ($NH_3$), cyano ($CN^-$), azide ($N_3^-$), ethylenediamine ($C_2H_8N_2$), phen(1,10-phenanthroline) ($C_{12}H_8N_2$), 2,2'-bipyridine ($C_{10}H_8N_2$), pyridine ($C_5H_5N$), acetonitrile ($CH_3CN$), as well nitrogen containing molecules of the form $N_xO_y$ (in which x and y≥1) such as nitric oxide (NO), nitrous oxide ($N_2O$), nitrogen dioxide ($NO_2$).

In particular embodiments, the method comprises forming a silicon-containing CEM layer directly by an atomic layer deposition utilizing separate precursor molecules, AX and BY according to the expression (4) below:

$$AX_{(gas)} + BY_{(gas)} + [O] = AB_{(solid)} + XY_{(gas)} \tag{4}$$

wherein "A" of expression (4) corresponds to a metal, such as a transition metal, [O] corresponds to an oxidising agent and AB corresponds to a metal silicate.

In these embodiments, "X" of expression (4) may comprise one or more of an organic ligand such as alkylamide, alkylarylamide, amidinate (AMD), cyclopentadienyl (Cp), methylcyclopentadienyl (MeCp), ethylcyclopentadienyl (EtCp), pentamethylcyclopentadienyl ($C_5(CH_3)_5$), 2,2,6,6-tetramethylheptane-3,5-dionato (thd), acetylacetonato (acac), dimethylglyoximato (dmg), 2-amino-pent-2-en-4-onato (apo), 1-dimethylamino-2-methyl-2-butanolato (dmamb), 1-dimethylamino-2-methyl-2-propanolato (dmamp) and carbonyl (CO).

Accordingly, in some embodiments, a nickel-based precursor AX may comprise, for example, tetrakis(diethylamino)nickel (Ni(TDEA)), tetrakis(ethylmethylamino)nickel (Ni(TEMA)), tetrakis(dimethylamino) nickel (Ni(TDMA)), nickel amidinate (Ni(AMD)), nickel dicylcopentadienyl (Ni(Cp)$_2$), nickel diethylcyclopentadienyl (Ni(EtCp)$_2$), bis(2,2,6,6-tetramethylheptane-3,5-dionato)Ni(II) (Ni(thd)$_2$), nickel acetylacetonate (Ni(acac)$_2$), bis(methylcyclopentadienyl) nickel (Ni(CH$_3$C$_5$H$_4$)$_2$, nickel dimethylglyoximate (Ni(dmg)$_2$), nickel 2-amino-pent-2-en-4-onato (Ni(apo)$_2$), Ni(dmamb)$_2$ where dmamb=1-dimethylamino-2-methyl-2-butanolate, Ni(dmamp)$_2$ where dmamp=1-dimethylamino-2-methyl-2-propanolate, bis(pentamethylcyclopentadienyl) nickel (Ni(C$_5$(CH$_3$)$_5$)$_2$), and nickel carbonyl (Ni(CO)$_4$).

In expression (4), the precursor "BY" may comprise a silicon halide, such as silicon tetrafluoride (SiF$_4$) or silicon tetrachloride (SiCl$_4$) or a silicon-donating organic molecule such as an alkylsilane, such as triethylsilane, a silicon alkoxide, such as tetraethyl orthosilicate (TEOS), a siloxane, a silazane or a silicon alkyl amide such as silicon tetrakis (ethylmethyl)amide. The oxidising agent [O] may comprise oxygen (O$_2$), water (H$_2$O), ozone (O$_3$) or a plasma generated species of oxygen (O).

In these embodiments, the method may comprise a repeated pulsing sequence comprising pulsing (1) the "AX" or "BY" precursor (2) ozone, (3) the "BY" or "AX" precursor and (4) ozone. Alternatively or additionally, the method may comprise a repeated pulsing sequence comprising pulsing (1) the precursors "AX" and "BY" together and (2) ozone.

In some embodiments, when the precursor "BY" is also an oxygen donating organic molecule, the atomic layer deposition may dispense with an oxidising agent. In these embodiments, the precursor "AX" may, in particular, comprise a metal alkyl amide, such as tetrakis(diethylamino) nickel and the precursor "BY" may comprise a silanol such as tris(tert-butoxy)silanol.

In other embodiments, an extrinsic dopant providing a back donating metal ligand, may be utilized in addition to precursors AX and BY to form the silicon-containing CEM layer. In that case, the precursor AX may alternatively comprise a metal halogen, such as a nickel tetrachloride (NiCl$_4$). The extrinsic dopant, which may co-flow with the precursor "AX", may permit formation of back-donating ligands such as ammonia (NH$_3$) on the metal substantially in accordance with expression (5) below:

$$AX_{(gas)}+NH_3+BY_{(gas)}+[O]=AB:NH_{3(solid)}+XY_{(gas)} \qquad (5)$$

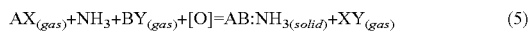

In particular embodiments, the method may utilize a dopant molecule providing a back-donating carbon-metal or nitrogen-metal bond, such as ammonia (NH$_3$), methane (CH$_4$), carbon monoxide (CO) but other molecules containing carbon and/or nitrogen and providing back donating to the metal through other bonds or elements may also be used.

Ligands providing back donating nitrogen-metal bonds may comprise, for example, nickel-amides, nickel-imides, nickel-amidinates and ligands providing back donating through other elements may comprise, for example, triphenylphosphine or halogen, for example, fluorine, chlorine and bromine.

Note that in all these embodiments, the concentrations of the precursor molecules "AX" and "BY" as well as the dopant may be adjusted so as to bring about a final atomic concentration of nitrogen or carbon dopant comprising a back-donating ligand in the finally manufactured device of between approximately 0.1 atom % and 15.0 atom %. Note also that the concentrations of the precursor molecules "AX" and "BY" and/or the pulsing durations of one or more precursors during the pulsing sequence may be adjusted to bring about a final atomic concentration of silicon in the finally manufactured device of between about 1 atom % and 20 atom %. Note, however, that the final atomic concentration of silicon in the finally manufactured device may be higher or lower than that of the nitrogen or carbon dopant.

In these and other embodiments for directly forming the silicon-containing CEM layer, the method may utilize a temperature between 20° C. to 800° C. Preferably, however, the method utilizes a temperature below 500° C., for example, 400° C., 300° C., 250° C., 200° C., 100° C. or less. Such temperatures may be lower than those used for forming corresponding TMO layers by ALD or MOCVD and may enable cheaper and/or faster production of the finally manufactured device with better maintenance of functionality in the CEM layer.

In certain embodiments, a single two-precursor or three-precursor cycle (for example, as described with reference to expression (6) or (7)) may bring about of a thickness in a silicon-containing CEM layer approximately in the range of 0.6 Å to 5.0 Å per cycle. Accordingly, in one embodiment the method may comprise forming a silicon-containing CEM layer of thickness about 500.0 Å by an atomic layer deposition process comprising 800-900 cycles delivering a thickness of about 0.6 Å per cycle. In another embodiment, the method may comprise forming the silicon-containing CEM layer by an atomic layer deposition process comprising 100 precursor cycles delivery a thickness of about 5 Å per cycle.

In particular embodiments, in which the silicon-containing CEM layer is directly formed, the method provides for an in-situ annealing which may permit an improvement in layer properties of the silicon-containing layer or may be used to incorporate a dopant comprising a back-donating material, such as in the form of carbonyl or ammonia, in the primary CEM layer. The in situ annealing may be performed utilizing temperatures approximately in the range of 50.0° C. to 800.0° C. In situ annealing times may vary from a duration approximately in the range of 1.0 seconds to 5.0 hours. In some embodiments, annealing times may vary within more narrow ranges, such as, for example, from approximately 0.5 minutes to approximately 180.0 minutes.

In particular embodiments, the method comprises forming a silicon-containing metal layer by an atomic layer deposition utilizing separate precursor molecules, AX and BY according to the expression (8) below:

$$AX_{(gas)}+BY_{(gas)}+[R]=AB_{(solid)}+XY_{(gas)} \qquad (6)$$

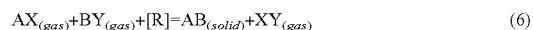

wherein "A" of expression (6) corresponds to a metal such as a transition metal, [R] corresponds to a reducing agent and AB corresponds to a metal silicide.

In these embodiments, "X" of expression (6) may comprise one or more an organic ligand, such as alkylamide, alkylarylamide, amidinate (AMD), dicyclopentadienyl $(Cp)_2$, diethylcyclopentadienyl $(EtCp)_2$, methylcyclopentadienyl $(CH_3C_5H_4)$, pentamethylcyclopentadienyl $C_5(CH_3)_5$, 2,2,6,6-tetramethylheptane-3,5-dionato (thd), acetylacetonato (acac), dimethylglyoximato (dmg), 2-amino-pent-2-en-4-onato (apo), 1-dimethylamino-2-methyl-2-butanolato (dmamb), 1-dimethylamino-2-methyl-2-propanolato (dmamp), 1,4-di-isopropyl-1,3-diazabutadienyl ($^i$Pr-DAD) and carbonyl (CO).

Accordingly, in some embodiments, a nickel-based precursor AX may comprise, for example, tetrakis(diethylamino)nickel (Ni(TDEA)), tetrakis(ethylmethylamino)nickel (Ni(TEMA)), tetrakis(dimethylamino)nickel (Ni(TDMA)), nickel amidinate (Ni(AMD)), nickel dicylcopentadienyl (Ni $(Cp)_2$), nickel diethylcyclopentadienyl $(Ni(EtCp)_2)$, bis(pentamethylcyclopentadienyl) nickel $(Ni(C_5(CH_3)_5)_2)$, bis(2,2,6,6-tetramethylheptane-3,5-dionato)Ni(II) $(Ni(thd)_2)$, nickel acetylacetonate $(Ni(acac)_2)$, bis(methylcyclopentadienyl) nickel $(Ni(CH_3C_5H_4)_2$, nickel dimethylglyoximate (Ni $(dmg)_2$), nickel 2-amino-pent-2-en-4-onato $(Ni(apo)_2)$, $Ni(dmamb)_2$ where dmamb=1-dimethylamino-2-methyl-2-butanolate, $Ni(dmamp)_2$ where dmamp=1-dimethylamino-2-methyl-2-propanolate, bis(1,4-di-isopropyl-1,3-diazabutadienyl) nickel $(Ni(^iPr-DAD)_2)$ and nickel carbonyl $(Ni(CO)_4)$.

In expression (6), the precursor "BY" may comprise a silicon halide, such as silicon tetrafluoride $(SiF_4)$ or silicon tetrachloride $(SiCl_4)$ or a silicon-donating organic molecule such as an alkylsilane, for example, triethylsilane, a silicon alkoxide, such as tetraethyl orthosilicate (TEOS), a siloxane, a silazane or a silicon alkyl amide such as silicon tetrakis (ethylmethyl)amide. The reducing agent may, in particular, comprise hydrogen $(H_2)$ or ammonia $(NH_3)$.

In these embodiments, the method may comprise a repeated pulsing sequence comprising pulsing (1) the "AX" or "BY" precursor (2) ammonia, (3) the "BY" or "AX" precursor and (4) ammonia. Those skilled in the art will appreciate that such a sequence deposits alternative layers of silicon and metal and that annealing these layers may lead to the formation of a metal silicide by diffusion of one or other or both of silicon and metal ions.

The annealing may be carried out in situ and may, in particular, comprise a rapid thermal annealing to temperature or temperatures between 50° C. and 900° C. The annealing (and deposition) of the metal layer may be carried out in vacuo or in a dry ambient atmosphere which is substantially free from oxygen or other oxidant so as to ensure the formation of the silicon-containing metal layer prior to its oxidation.

Note that although it is possible to adjust the concentrations of the precursors "AX" and "BY" to bring about doping of the silicon and/or metal layers or to introduce an extrinsic dopant during the formation of the silicon and metal layers, it is preferable that the dopant is introduced during or subsequent the oxidation of the silicide. Note further that the concentrations of the precursor molecules "AX" and "BY" and/or the pulsing durations of the pulsing sequence may be adjusted to bring about an atomic concentration of silicon providing an atomic concentration of silicon in the finally manufactured device of between about 1.0 atom % and 20.0 atom %.

Accordingly, in these embodiments, the method may further comprise oxidising the silicon-containing metal layer to a form a silicate. The oxidation may, in particular, comprise one or more of a wet oxidation, a dry oxidation or a plasma oxidation. The wet and dry oxidations may, for example, be carried out by exposing the silicon-containing metal layer to steam $(H_2O)$ and oxygen $(O_2)$ respectively at a temperature or temperatures between 150° C. and 900° C. during a period of 1 minute to 30 minutes. The plasma oxidation may be carried out by exposing to oxygen $(O_2)$ or ozone $(O_3)$ at a temperature or temperatures between 50° C. and 400° C. for a period of 1 minute to 30 minutes.

In particular embodiments, the method may comprise oxidising the silicon-containing metal layer with concomitant incorporation of a dopant as a metal ligand. In these embodiments, a dopant precursor molecule, such as carbon monoxide (CO), ammonia $(NH_3)$, chlorine $(Cl_2)$ or other halogen may admixed with the above-mentioned oxidants. The admixture may, in particular, provide for exposure to the dopant at a temperature between 20° C. and 1000° C., in particular 50° C. to 800° C. during a period of between 1 second to 5.0 hours.

In other embodiments, the method may further comprise doping the silicate layer. The doping may, for example, be carried out by exposing the silicate layer to a dopant precursor molecule, such as carbon monoxide (CO), ammonia $(NH_3)$, chlorine $(Cl_2)$ or other halogen at a temperature between 20° C. and 1000° C., in particular 50° C. to 800° C. during a period of between 1 second to 5.0 hours.

As mentioned above, the dopant precursor may comprise a molecule providing a back donating ligand for the transition metal. The back donating ligand may be formed not just from carbon monoxide, ammonia or halogen but also from other molecules such as those mentioned above.

Note that the silicon-containing CEM layer may be formed on a conductive substrate and/or be provided with a conductive overlay. The conductive substrate and the conductive overlay may be the same or different and may comprise one or more of such transition metals and transition metal compounds as titanium nitride, tantalum nitride, platinum, titanium, copper, aluminium, cobalt, nickel, tungsten, cobalt silicide, ruthenium, ruthenium oxide, chromium, gold, palladium, indium tin oxide, tantalum, silver, iridium, and iridium oxide.

In one embodiment, therefore, the method comprises forming a conductive substrate and forming the silicon-containing CEM layer on or over the conductive substrate. In another embodiment, the method comprises forming a conductive overlay on the silicon-containing CEM layer. In a still further embodiment, suitable for forming a CeRAM memory, the method comprises forming a conductive substrate, forming the silicon-containing CEM layer on or over the conductive substrate and forming a conductive overlay on the silicon-containing conductive overlay.

In a second aspect, the present disclosure provides a CEM switching device comprising a silicon-containing CEM layer. The CEM switching device may, in particular, comprise a silicon-containing CEM layer provided on a conductive substrate. Alternatively or additionally, it may comprise a silicon-containing CEM layer provided with a conductive overlay therein. In one embodiment, the CEM switching device comprises a silicon-containing CEM layer which is sandwiched between a conductive substrate and a conductive overlay.

The conductive substrate and the conductive overlay may be the same or different and may comprise one or more of such transition metals and transition metal compounds as titanium nitride, tantalum nitride, platinum, titanium, copper, aluminium, cobalt, nickel, tungsten, cobalt silicide, ruthenium, ruthenium oxide, chromium, gold, palladium, indium tin oxide, tantalum, silver, iridium, and iridium oxide.

The silicon-containing CEM layer may comprise a doped silicate of a d- or f-block metal. The silicon-containing CEM layer may, in particular, comprise a silicate of one or more of aluminum, cadmium, chromium, cobalt, copper, gold, iron, manganese, mercury, molybdenum, nickel, palladium, rhenium, silver, tantalum, tin, titanium, vanadium, rhenium, ruthenium, silver, tantalum, tin, titanium, vanadium, yttrium, ytterbium and zinc. In a particular embodiment, the silicon-containing CEM layer comprises $Ni_zSi_xO_y$:CO wherein x, y and z are greater than zero.

The silicon-containing CEM layer may have a thickness between 1 nm and 150 nm, for example, between 10 nm and 100 nm. In one embodiment, it has a thickness between 15 nm and 20 nm. The silicon content of the silicon-containing CEM layer may be between 1.0 atom % and 20.0 atom %, for example, between 1.0 atom % and 15.0 atom %. The dopant content of the silicon-containing CEM layer may be between approximately 0.1 atom % and 15.0 atom %. In certain embodiments, the dopant is carbon (for example, in the form of a carbonyl or other ligand) and the silicon content of the silicon-containing CEM layer exceeds its carbon content.

The dopant may, in particular, derive from a ligand or molecule providing a carbon-metal bond, a halogen-metal bond, a nitrogen-metal bond, a sulphur-metal bond or a phosphorus-metal bond in the silicate. Suitable dopants include those which can donate electrons to the metal silicate. Such "back-donating" may provide that the CEM layer exhibits the property of a controllable and reversible donation of electrons to a conduction band of the metal silicate during operation of the device—thus permitting the metal silicate to switch between a relatively conductive state and a relatively insulative state.

Suitable dopant precursors for back donating dopants may comprise carbon monoxide (CO), ammonia ($NH_3$) or amine ($NR_3$, R=H or alkyl or aryl), such as ethylene diamine ($C_2H_8N_2$), as well as nitrogen oxides of formula $N_xO_y$, viz., nitrous oxide, nitric oxide or nitrogen dioxide.

Other suitable back donating dopants may arise from an organometallic precursor for the metal compound comprising one or more of a carbon-containing ligand, a nitrogen-containing ligand, a phosphorus-containing ligand or a sulfur-containing ligand. Such ligands include carbonyl (—CO), chloro (—Cl), amine (—$NH_3$), alkyl amide (—$NR_3$), sulphide (—SR) and phosphine (—$PR_3$R=aryl, for example, phenyl) as well as more complex ligands such as amidinate (AMD), cyclopentadienyl (Cp), methylcyclopentadienyl (MeCp), ethylcyclopentadienyl (EtCp), pentamethylcyclopentadienyl (MesCp), 2,2,6,6-tetramethylheptane-3,5-dionato (thd), acetylacetonato (acac), dimethylglyoximato (dmg), 2-amino-pent-2-en-4-onato (apo), 1-dimethylamino-2-methyl-2-butanolato (dmamb), 1-dimethylamino-2-methyl-2-propanolato (dmamp).

In a third aspect, the present disclosure provides a thin film comprising a silicon-containing CEM of a d- or f-block transition metal. The silicon-containing CEM may, in particular, comprise one or more of a doped silicate of aluminum, cadmium, chromium, cobalt, copper, gold, iron, manganese, mercury, molybdenum, nickel, palladium, rhenium, silver, tantalum, tin, titanium, vanadium, rhenium, ruthenium, silver, tantalum, tin, titanium, vanadium, yttrium, ytterbium and zinc.

The silicon content of the silicon-containing CEM layer may be between 1.0 atom % and 20.0 atom %, for example, 5.0 atom %, 10.0 atom % or 15.0 atom % or over. The dopant content of the silicon-containing CEM layer may be between approximately 0.1 atom % and 15.0 atom %. In certain embodiments, the dopant is carbon (in the form of a carbonyl or other ligand) and the silicon content of the silicon-containing CEM layer exceeds its carbon content.

The silicon-containing CEM layer may be represented by formula $M_zSi_xO_y$:dopant wherein x, y and z are greater than zero. The dopant may be as described for the first and second aspects. In a particular embodiment, the silicon-containing CEM layer comprises $Ni_zSi_xO_y$:CO wherein x, y and z are greater than zero.

Figure 2:
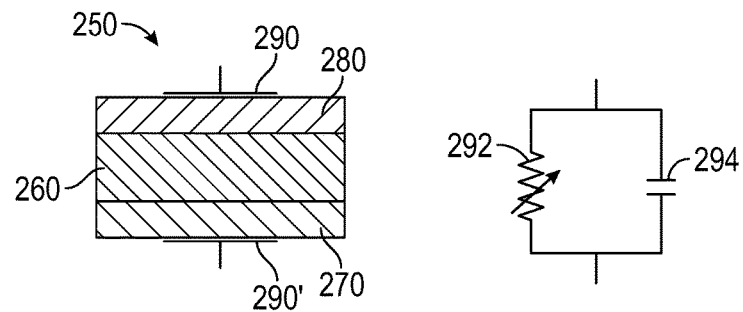
FIG. 2 shows a schematic illustration of a CEM switching device of one embodiment of the switching device of the present disclosure.

Referring now to FIG. 2, there is shown a switching device 250, such as may be used as a storage element, wherein a silicon-containing CEM layer 260 is provided on a conductive substrate 270 and a conductive overlay 280 is provided on the silicon-containing CEM layer. The conductive substrate 270 and the conductive overlay 280 may, in particular, comprise platinum electrode deposited on or over a silicon substrate (not shown) by a physical vapour deposition, a chemical vapour deposition or any other suitable technique.

The silicon-containing CEM layer 260 may, in particular, comprise a nickel silicate which is doped by carbonyl (for example, in the form of carbonyl ligand (—CO)). A general formula for the doped nickel silicate layer may be written $Ni_xSi_yO_z$:CO where x, y and z are greater than zero. The silicon-containing CEM layer 260 may be formed by an atomic layer disposition of nickel carbonyl $Ni(CO)_4$ and silicon tetrachloride $SiCl_4$ in the presence of ozone as oxidant. The pulsing sequence may, in particular, comprise sequential exposure of the substrate (comprising a platinum electrode) at a temperature below 400° C. by pulsing (1) $Ni(CO)_4$, (2) ozone, (3) $SiCl_4$ and (4) ozone and repeating the sequence until a thin film of a doped nickel silicate of thickness about 15 nm to 20 nm has been built up.

The CEM switching device may exhibit characteristics of both variable resistance and variable capacitance. In other words, the CEM switching device may be considered as a variable impedance device in which the impedance depends at least in part on resistance and capacitance characteristics of the device if measured across device terminals 290 and 290'. The equivalent circuit for a variable impedance device may comprise a variable resistor 292, such as variable resistor, in parallel with a variable capacitor 294. Of course, although a variable resistor and variable capacitor are depicted in FIG. 2 as comprising discrete components, the variable impedance device, such as that shown, may comprise a substantially homogenous CEM.

Figure 3:
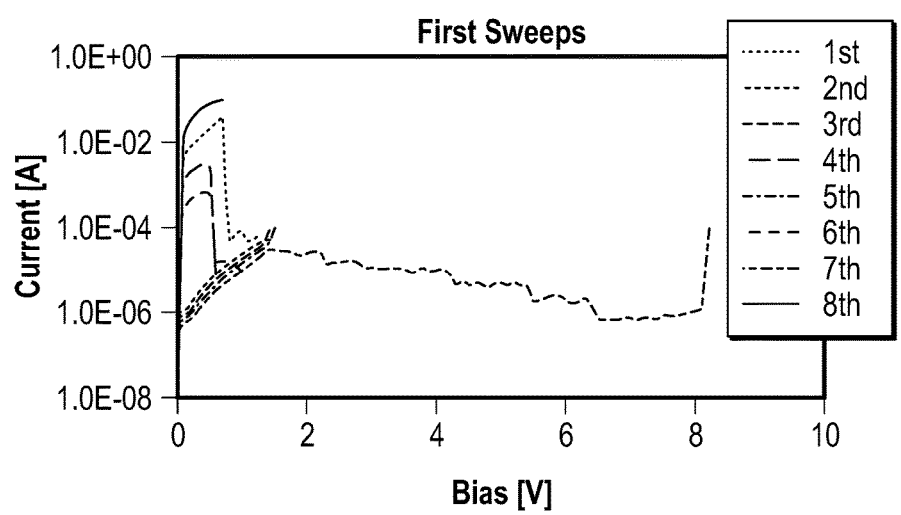
FIG. 3 shows a schematic illustration of a (part) current versus voltage profile for the switching device of FIG. 2.

FIG. 3 is a graph showing the results of a current versus voltage study of this CEM switching device. As may be seen, the first sweeps (1 to 8 indicated at RHS) of the device show that the device is "born-on" in its high conductivity (low resistance) state (see sweep 1) and switches at a voltage (around 2V) comparable to that for a doped nickel oxide layer to a low conductivity (high resistance) state (see sweep 2). Those skilled in the art will appreciate that the switching behaviour is similar to that of CEM switching devices in which the CEM layer comprises a TMO.

Figure 4:
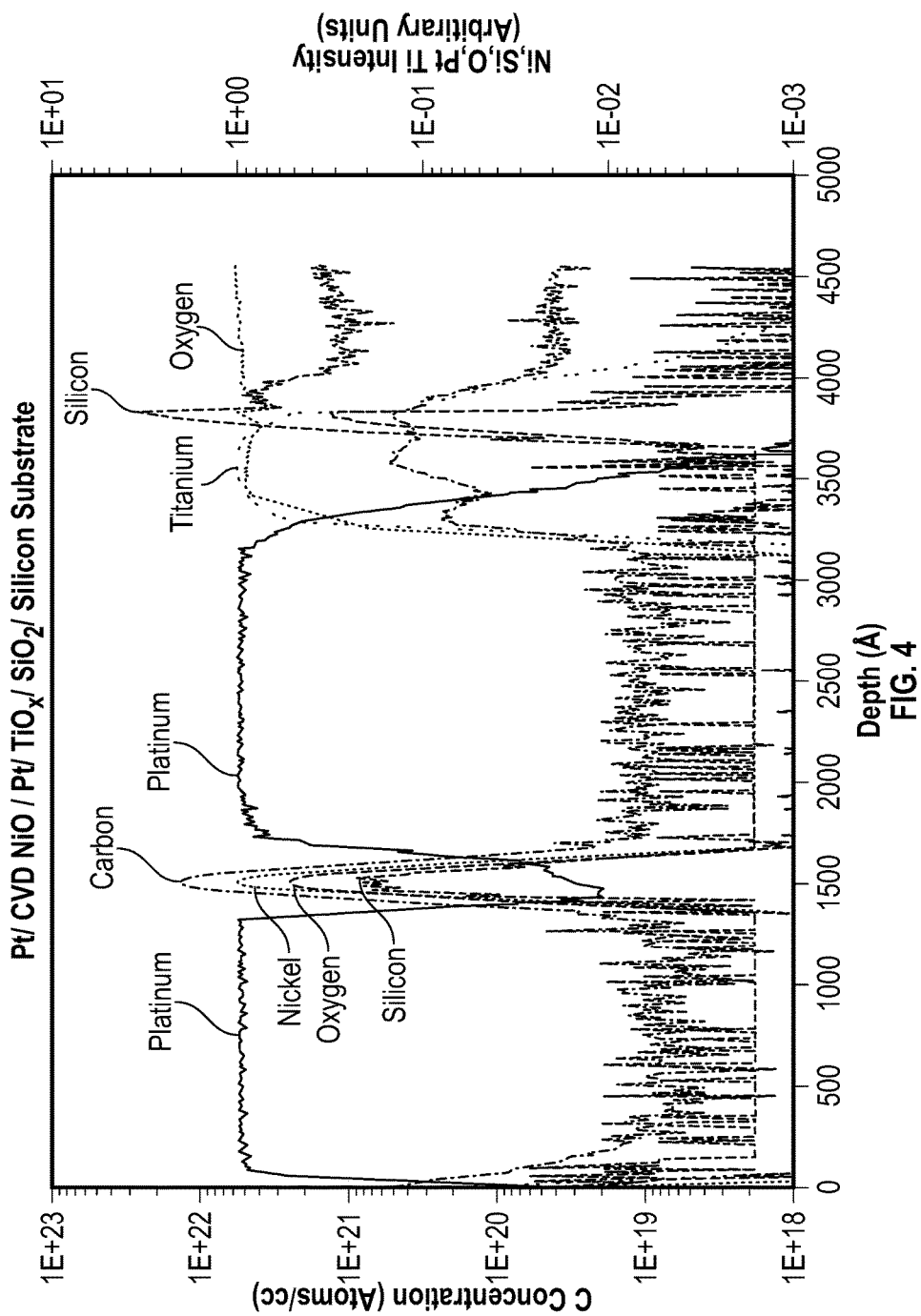
FIG. 4 shows a graph plotting the results of a study of the CEM switching device of FIG. 2 by secondary ion mass spectrometry (SIMS)

FIG. 4 is a graph showing a secondary ion mass spectrometry (SIMS) study of the CEM switching device. The graph corresponds to the structural profile of the switching device described above wherein intervening layers comprising silica and titanium oxide ($TiO_x$) are provided between the silicon substrate and its platinum electrode. These layers are provided respectively to isolate the silicon substrate from the device and for better adhesion of its platinum electrode.

The two ordinate axes indicate the relative content of nickel, silicon and other elements (RHS) as compared to the absolute concentration of carbon (LHS). As may be seen, the silicon profile has a peak which corresponds to a layer within the device that coincides with peaks in the carbon profile, the nickel profile and the oxygen profile—and reporting the silicon-containing CEM layer.

Figure 5:
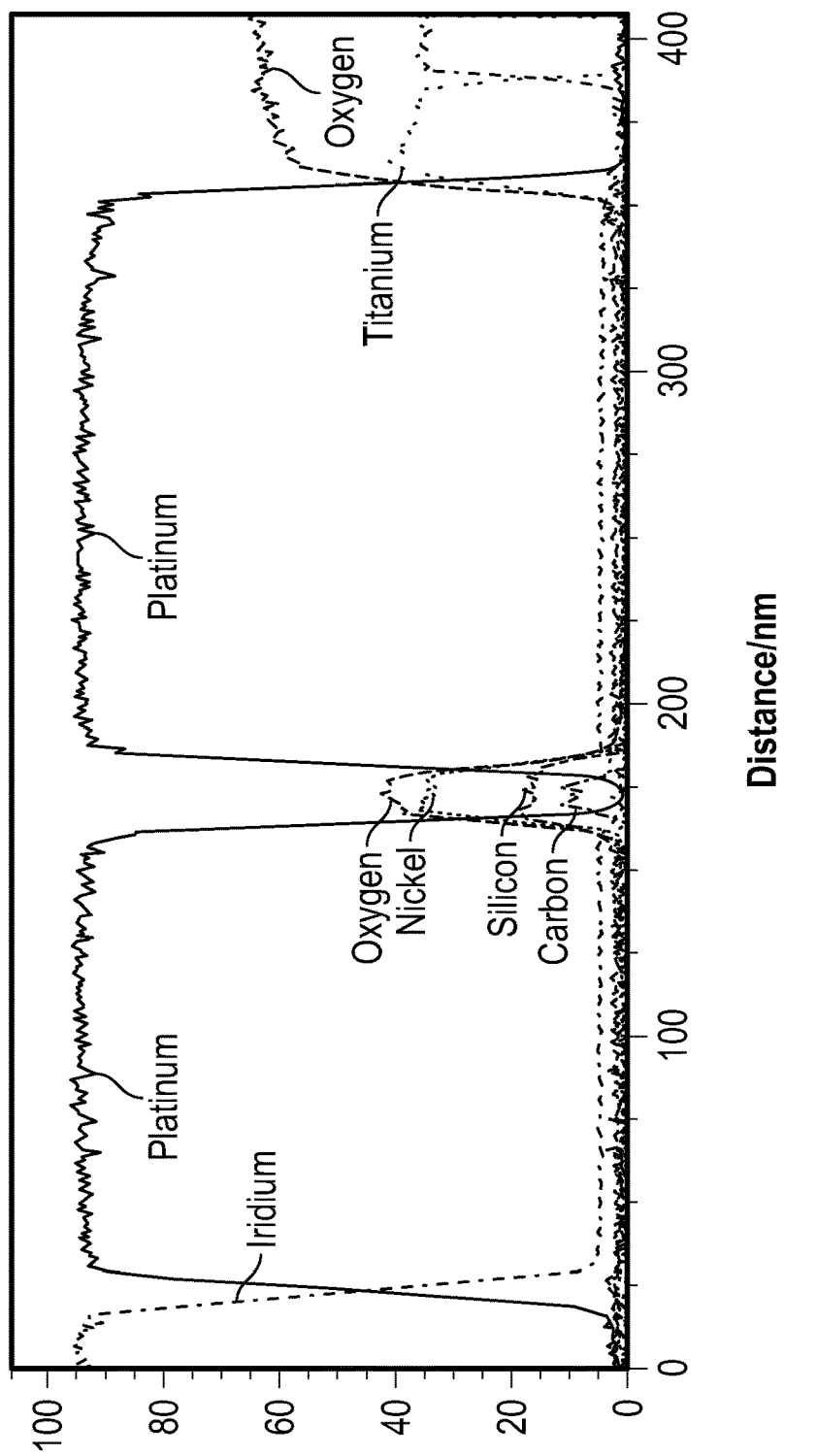
FIG. 5 shows a graph plotting the results of a study of the CEM switching device of FIG. 2 by energy-dispersive X-ray spectroscopy (EDS)

FIG. 5 is a graph showing an energy-dispersive X-ray spectroscopy (EDS) study of the CEM switching device. The graph also corresponds to the structural profile of the switching device (as described in relation to FIG. 4). As may be seen, the silicon profile has a peak which corresponds to a layer within the device that coincides with peaks in the carbon profile, the nickel profile and the oxygen profile— and reporting the silicon-containing CEM layer. The content of silicon in the silicon-containing CEM layer is estimated from the graph as approximately 15 atom %.

FIG. 6 shows a flow diagram generally illustrating alternative methods for forming the silicon-containing CEM layer of the CEM switching device. In one embodiment, the silicon-containing CEM layer is formed directly and incorporates a dopant. This silicon-containing CEM layer may, in particular, comprise a transition metal silicate which may be represented by formula $M_xSi_yO_z$:dopant, for example, a nickel silicate and a dopant which is a back donating ligand such as carbonyl, ammonia or halogen formed by an atomic layer deposition as described above.

In another embodiment, a silicon-containing metal layer is formed by an atomic layer deposition as a metal silicate, such as nickel silicate and treated by annealing at a temperature below 500° C., for example, in an atmosphere comprising a dopant precursor, such as carbon monoxide, ammonia or halogen. The treatment of the silicon-containing metal layer, which may be represented by formula $M_xSi_yO_z$ results in the formation of the silicon-containing CEM layer.

In a further embodiment, a silicon-containing metal layer is formed by co-sputtering as a metal silicide, such as nickel silicide at a temperature below 500° C., for example, in an atmosphere comprising a dopant precursor such as carbon monoxide, ammonia or halogen. The silicon-containing metal layer, which may be represented as $M_xSi_y$:dopant is subsequently oxidised by annealing in an oxygen atmosphere, for example, to form the silicon-containing CEM layer as $Ni_xSi_yO_z$:CO, for example.

In another embodiment, which is not shown in FIG. 6, a silicon-containing metal layer is formed by co-sputtering and annealing as a metal silicide, such as nickel silicide at a temperature below 500° C. using a carbon target and an atmosphere of comprising an oxidant such as oxygen or ozone. The co-sputtering leads directly to a silicon-containing CEM layer, such as $Ni_xSi_yO_z$:CO.

In still another embodiment, a silicon-containing metal layer is formed by co-sputtering and annealing as a metal silicide, such as nickel silicide at a temperature below 500° C. The silicon-containing metal layer, which may be represented by formula MxSiy is subsequently oxidised by annealing in an oxygen atmosphere, for example, to form a silicon-containing metal layer as a silicate, such as nickel silicate. This silicon-containing metal layer, which may be represented by formula $M_xSi_yO_z$ is subsequently treated by annealing at a temperature below 500° C., for example, in an atmosphere comprising a dopant precursor, such as carbon monoxide, ammonia or halogen. The treatment of the silicon-containing metal layer results in the formation of the silicon-containing CEM layer as $Ni_xSi_yO_z$:CO, for example.

The present disclosure provides methods which allow the fabrication of a CEM layer for a CEM switching at temperatures which are lower than those conventionally used. In some embodiments, the temperatures used for forming the CEM layer may not exceed 500° C. or 400° C. and can be substantially lower. Such low temperatures may enable cheaper manufacture of the CEM switching device and may reduce the likelihood of a resistive layer tending to form between the CEM layer and the conductive substrate and/or conductive overlay.

The presently disclosed methods may provide a CEM layer that is amorphous and so allow better control over the formation of the CEM layer as compared to TMO CEM layers. Such control may provide for improved step coverage of the CEM layer.

Note that references in this disclosure reporting a range, such as "between 50° C. and 400° C." include references to start and end values, for example 50° C. and 400° C.

Note further that references to a silicon-containing CEM layer comprising a doped metal silicate include references to a silicon-containing CEM layer including more than one such silicate. The silicon-containing CEM layer may be formed as a layer comprising a particular metal silicate or as layers of different metal silicates.

We claim:

1. A CEM switching device comprising a correlated electron material (CEM) layer provided on a conductive substrate, wherein the CEM layer comprises a silicon-containing CEM layer comprising a silicate of formula $M_xSi_yO_z$:dopant, wherein M is a d- or f-block element, the dopant comprises carbon, halogen, nitrogen, sulfur or phosphorus and x, y and z are greater than zero and not necessarily integers.

2. The CEM switching device according to claim 1, further comprising a conductive overlay provided on the silicon-containing CEM layer.

3. The CEM switching device according to claim 1, wherein the silicon-containing CEM layer has a silicon content between 1 atom % and 20 atom %.

4. The CEM switching device according to claim 3, wherein the silicon-containing CEM layer has a dopant content which is less than the silicon content.

5. The CEM switching device according to claim 1, wherein the metal M is selected from the group consisting of aluminum, cadmium, chromium, cobalt, copper, gold, iron, manganese, mercury, molybdenum, nickel, palladium, rhenium, silver, tantalum, tin, titanium, vanadium, rhenium, ruthenium, silver, tantalum, tin, titanium, vanadium, yttrium, ytterbium and zinc.

6. The CEM switching device according to claim 1, wherein the silicon-containing CEM layer is amorphous.

7. The CEM switching device according to claim 1, wherein the silicon-containing CEM layer comprises a carbon-containing ligand such as carbonyl.

8. The CEM switching device according to claim 1, wherein the d- or f-block element of the silicon-containing CEM layer is nickel.

9. The CEM switching device according to claim 1, wherein the silicon-containing CEM layer is born-on.

10. The CEM switching device according to claim 1, wherein the conductive substrate comprises one or more of titanium nitride, tantalum nitride, platinum, titanium, copper, aluminium, cobalt, nickel, tungsten, cobalt silicide, ruthenium, ruthenium oxide, chromium, gold, palladium, indium tin oxide, tantalum, silver, iridium, and iridium oxide.

11. A CEM switching device comprising a correlated electron material (CEM) layer provided with a conductive overlay, wherein the CEM layer comprises a silicon-containing CEM layer comprising a silicate of formula $M_xSi_yO_z$:dopant, wherein M is a d- or f-block element, the dopant comprises carbon, halogen, nitrogen, sulfur or phosphorus and x, y and z are greater than zero and not necessarily integers.

12. The CEM switching device according to claim 11, further comprising a conductive overlay provided on the silicon-containing CEM layer.

13. The CEM switching device according to claim 11, wherein the silicon-containing CEM layer has a silicon content between 1 atom % and 20 atom %.

14. The CEM switching device according to claim 13, wherein the silicon-containing CEM layer has a dopant content which is less than the silicon content.

15. The CEM switching device according to claim 11, wherein the metal M is selected from the group consisting of aluminum, cadmium, chromium, cobalt, copper, gold, iron, manganese, mercury, molybdenum, nickel, palladium, rhenium, silver, tantalum, tin, titanium, vanadium, rhenium, ruthenium, silver, tantalum, tin, titanium, vanadium, yttrium, ytterbium and zinc.

16. The CEM switching device according to claim 11, wherein the silicon-containing CEM layer is amorphous.

17. The CEM switching device according to claim 11, wherein the silicon-containing CEM layer comprises a carbon-containing ligand such as carbonyl.

18. The CEM switching device according to claim 11, wherein the silicon-containing CEM layer is born-on.

19. The CEM switching device according to claim 11, wherein the conductive overlay comprises one or more of titanium nitride, tantalum nitride, platinum, titanium, copper, aluminium, cobalt, nickel, tungsten, cobalt silicide, ruthenium, ruthenium oxide, chromium, gold, palladium, indium tin oxide, tantalum, silver, iridium, and iridium oxide.

20. A method for the manufacture of a CEM switching device, which method comprises:
    forming a conductive substrate; and
    forming a layer of a silicon-containing correlated electron material (CEM) on or over the conductive substrate, wherein the silicon-containing CEM layer comprises a silicate of formula $M_xSi_yO_z$:dopant, wherein M is a d- or f-block element, the dopant comprises carbon, halogen, nitrogen, sulfur or phosphorus and x, y and z are greater than zero and not necessarily integers.

* * * * *